(12) United States Patent
Liu

(10) Patent No.: US 8,208,230 B2
(45) Date of Patent: Jun. 26, 2012

(54) BINARY OUTPUT READER STRUCTURE (BORS) WITH HIGH UTILIZATION RATE

(75) Inventor: Yue Liu, Fremont, CA (US)

(73) Assignee: Headway Technologies, Inc., Milpitas, CA (US)

(*) Notice: Subject to any disclaimer, the term of this patent is extended or adjusted under 35 U.S.C. 154(b) by 1112 days.

(21) Appl. No.: 12/082,258

(22) Filed: Apr. 10, 2008

(65) Prior Publication Data

US 2009/0257153 A1 Oct. 15, 2009

(51) Int. Cl.
*G11B 5/39* (2006.01)
(52) U.S. Cl. ............ 360/324.12; 360/324.11; 360/324.1
(58) Field of Classification Search .............. 360/319, 360/324.11, 324.12, 324.2, 324.1
See application file for complete search history.

(56) References Cited

U.S. PATENT DOCUMENTS

| | | | |
|---|---|---|---|
| 6,512,661 B1 | 1/2003 | Louis | |
| 7,215,610 B2 | 5/2007 | Sako et al. | |
| 7,346,977 B2* | 3/2008 | Cyrille et al. | 29/603.15 |
| 7,471,491 B2* | 12/2008 | Sato et al. | 360/313 |
| 7,808,750 B2* | 10/2010 | Yanagisawa et al. | 360/324.12 |
| 2002/0191354 A1* | 12/2002 | Yoshikawa et al. | 360/324.1 |
| 2004/0012899 A1* | 1/2004 | Hasegawa et al. | 360/324.12 |
| 2004/0156148 A1 | 8/2004 | Chang et al. | |
| 2005/0146813 A1* | 7/2005 | Oshima | 360/324.12 |
| 2008/0013223 A1* | 1/2008 | Miyauchi et al. | 360/324.11 |
| 2009/0097169 A1* | 4/2009 | Sato et al. | 360/324.2 |
| 2010/0177447 A1* | 7/2010 | Yanagisawa | 360/319 |

* cited by examiner

*Primary Examiner* — Jefferson Evans
(74) *Attorney, Agent, or Firm* — Sallie Ackerman LLC; Stephen B. Ackerman

(57) ABSTRACT

We disclose a magnetic read head, and method for making it, that operates in a binary rather than an analog mode. This greatly boosts signal amplitude for high area density recording as device dimensions get smaller. The device is well suited to the inclusion of side shields which further reduces side reading errors. The device has a utilization efficiency close to 100%.

27 Claims, 8 Drawing Sheets

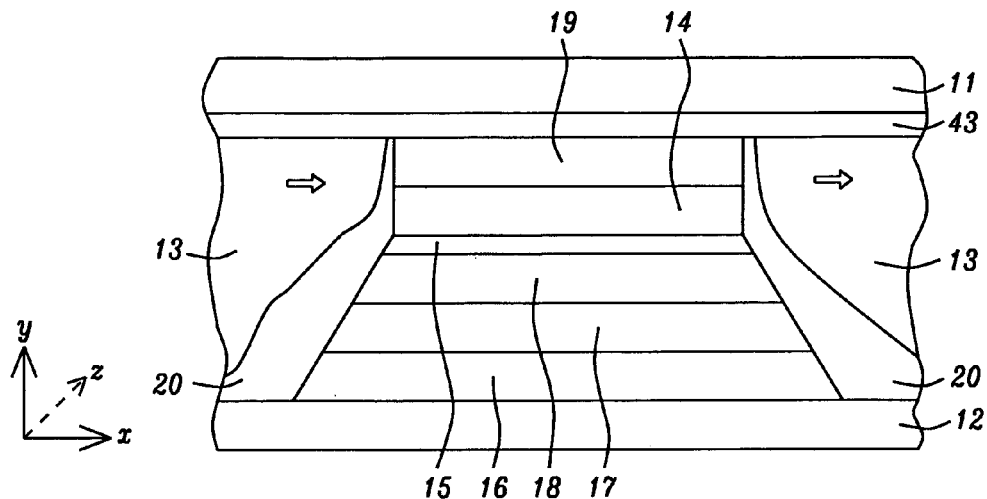
FIG. 1 – Prior Art
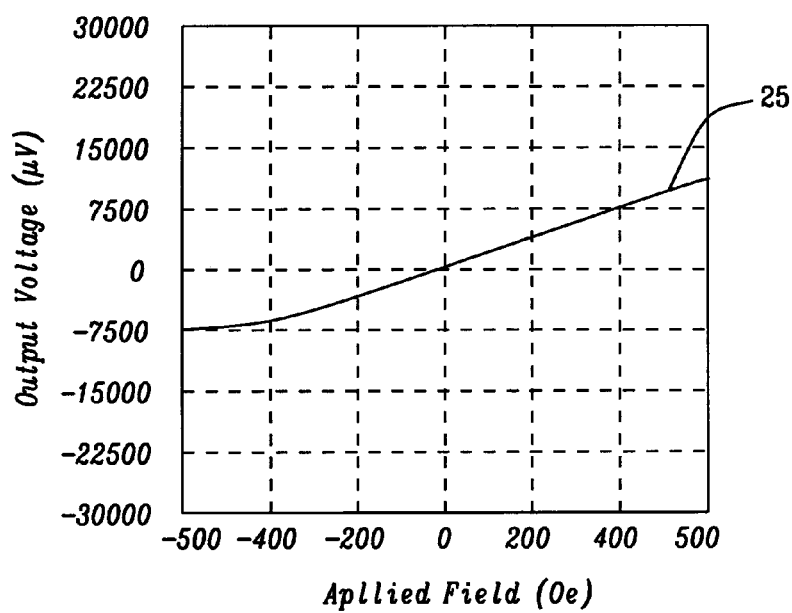
FIG. 2 – Prior Art

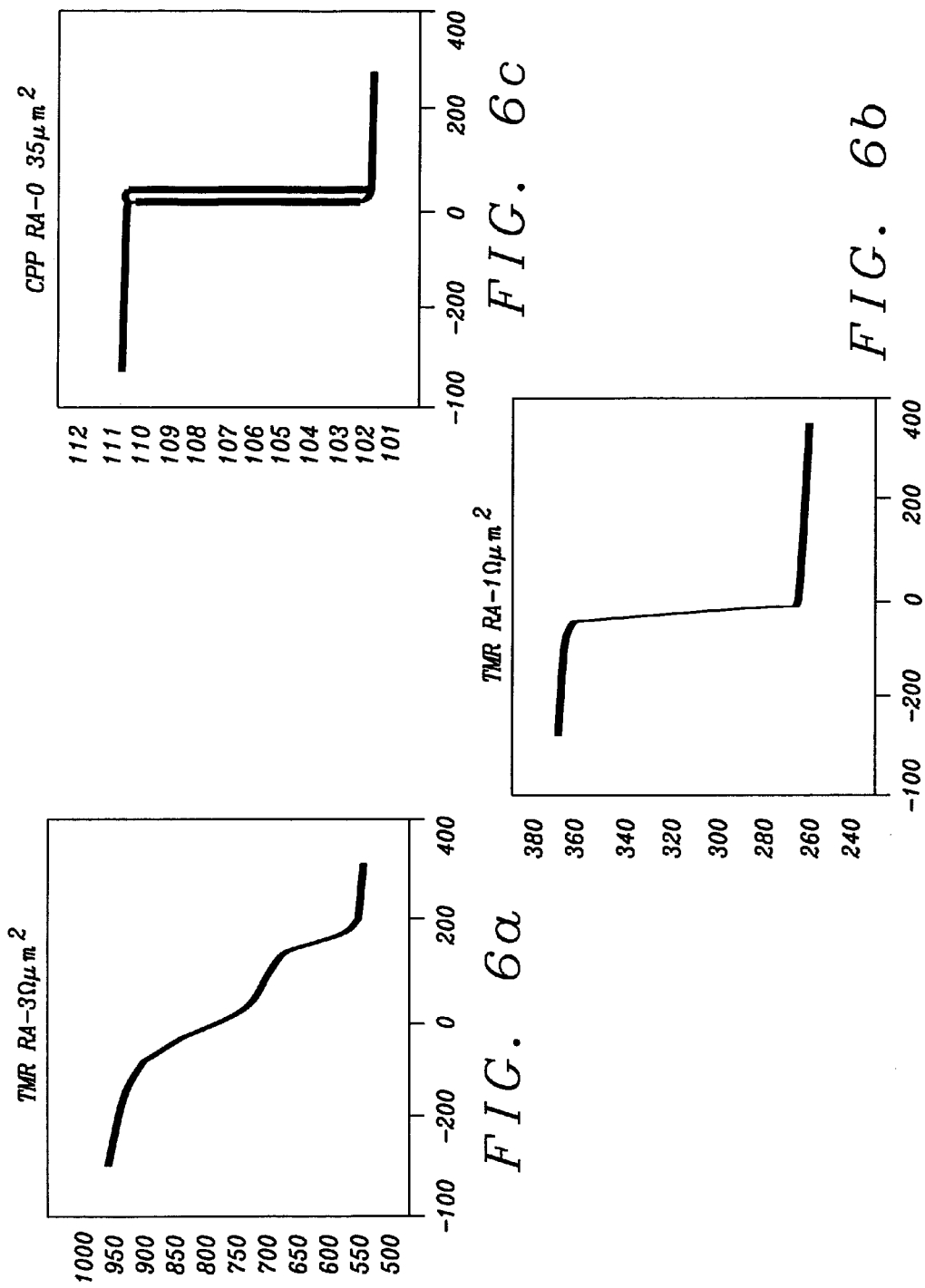

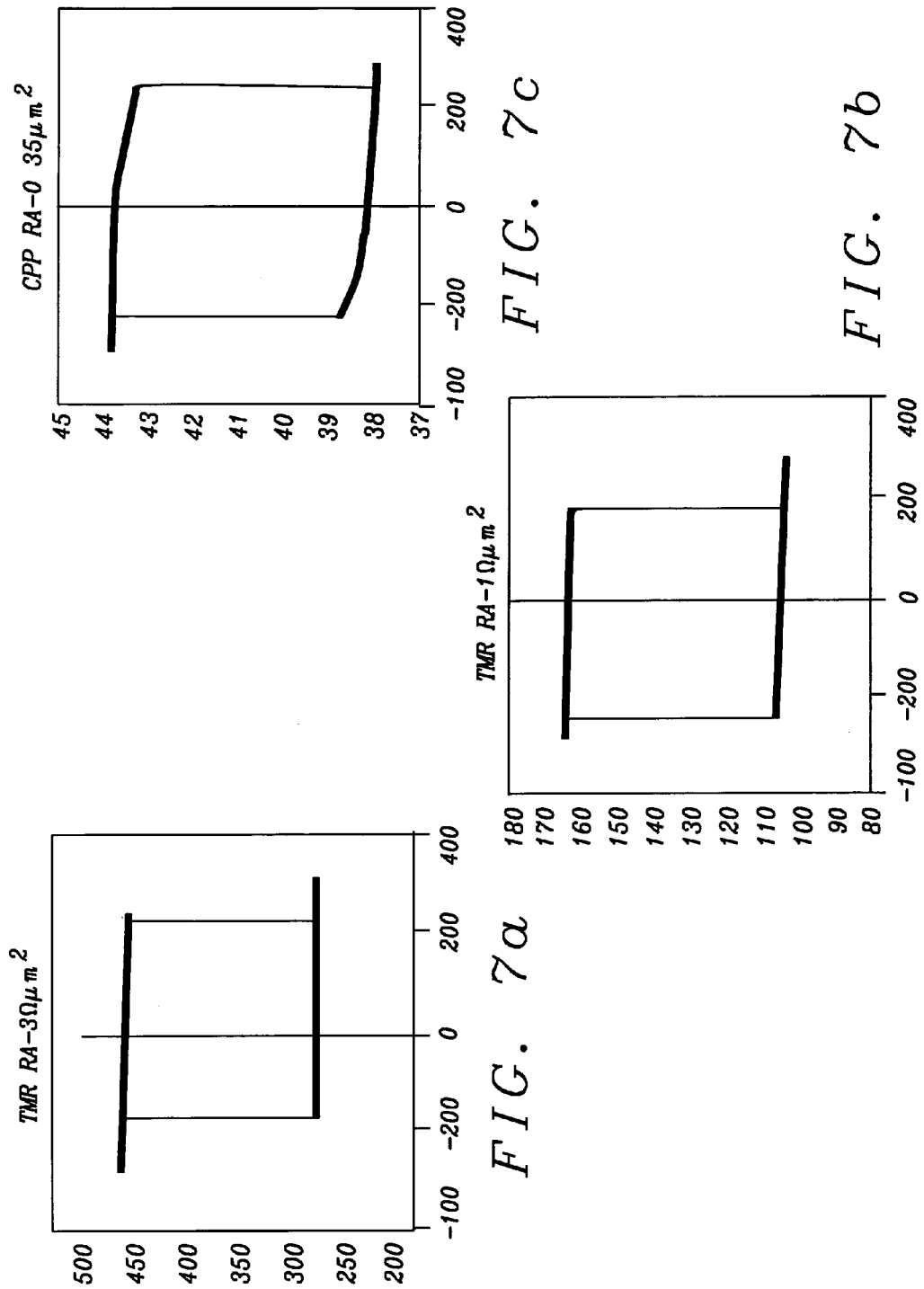

BINARY OUTPUT READER STRUCTURE (BORS) WITH HIGH UTILIZATION RATE

FIELD OF THE INVENTION

The invention relates to the general field of magnetic recording of digital information with particular emphasis on generating digital signals directly.

BACKGROUND OF THE INVENTION

For magnetic disk recording the end goal is an ability to write and read either 0 (represented by a low state) or 1 (represented by a high state). Till now, only analog output type reader designs have been implemented. To function properly, such devices need to keep the free layer longitudinally biased which result in low sensor utilization rate (defined as: output voltage/(bias voltage times full dR/R)). A device that was truly digital (as opposed to analog) would make more efficient use of the sensor's capabilities, thereby solving many of the problems currently associated with device dimension shrinking.

In FIG. 1 we show an ABS (air bearing surface) view of a typical current perpendicular to plane (CPP) read element. The sensor has top and bottom shields 11 and 12, respectively, and is patterned to have the required reader width (long dimension of free layer 14). Also shown are seed layer 16, pinning layer(s) 17, pinned layer(s) 18, and capping layer 19. Note the presence of hard magnets 13 that are magnetized in the X-direction, thereby magnetically biasing free layer 14 in its longitudinal direction. Depending on the nature of spacer layer 15, the sensor can be a tunneling magneto-resistive (TMR) type, including a current confined path (CCP), if layer 15 is insulating, or it could be a metallic giant magneto-resistive (GMR) read head if layer 15 is conductive. The remaining space is filled with insulation 20.

The stripe height (SH), as measured in the z-direction (normal to the plane of the figure), of the sensor is usually 0.9 to 1.3 times the reader width, depending on film properties, the particular reader width, hard bias strength, and device MRR (magneto-resistance ratio), etc. The goal is to achieve acceptable stability for free layer (FL) 14 through the provision of the proper bias. The utilization rate of this type of design ranges from 20-35% when used in conjunction with perpendicular magnetic recording (PMR).

In FIG. 2 we show curve 25 which is a plot of output voltage (in μV) as a function of the strength of the magnetic field which it is sensing, from −600 to 600 Oe, for a device of the prior art, said device having been given a longitudinal bias of about 1000 Oe. Without the presence of the latter, the central portion of curve 15 would lose its linearity, becoming non-reproducible and noisy, often changing every time the magnetization was reversed. The resistance R of the device is ~373% and the applied voltage is 140 mV. The total output voltage is ~20.4 mV corresponding to a total resistance change of ~54.4Ω and dR/R~14.6%. Since the optimum dR/R of the device is ~50%, its present utilization rate is ~29%.

The current generation of device readers has a width of about 70-100 nm. With high amplitude MgO films, reasonable performance can be achieved for area densities up to 350 Gb/in$^2$. For future high area density recording, device dimensions will be in the range of 20-50 nm, or smaller. For such devices to continue operating with a similar SH-to-reader width aspect ratio (AR) as well as with a similar device MRR, the R.A (Resistance Area product) needs to be reduced by a factor of about 4 relative to today's devices. Usually dR/R drops as R.A is reduced and device noise increases as dimensions get smaller. These factors imply that it is very difficult to outperform or even to maintain current output amplitudes. Additionally, the inter-coupling field will be much larger when the use of MgO lowers R.A so that lapping control to a SH of 30-50 nm will become increasingly more difficult.

A routine search of the prior art was performed with the following references of interest being found:

U.S. Pat. No. 6,512,661 (Louis) shows a GMR sensor including insulating bias layers surrounding the MR head. In U.S. Pat. No. 7,215,610, Sako et al. discuss digital output from a playing control system that is converted to analog output while U.S. Patent Application 2004/0156148 (Chang et al) discloses an MR head with longitudinal hard bias.

SUMMARY OF THE INVENTION

It has been an object of at least one embodiment of the present invention to provide a magnetic read head having a binary, rather than an analog, response when reading tracked magnetic data.

Another object of at least one embodiment of the present invention has been to provide a process for manufacturing said read head.

Yet another object of at least one embodiment of the present invention has been that said read head have a utilization rate of about 100%.

Still another object of at least one embodiment of the present invention has been to include side shields in said read head whereby errors due to accidental reading of adjacent tracks are minimized.

A further object of at least one embodiment of the present invention has been to compensate for offset fields so as to facilitate device operation in either a preferred state or a no preferred states mode, when the media field is zero.

These objects have been achieved by utilizing a reader design that can boost reader output by enabling a utilization rate up to 100%. In addition, the structure disclosed by the present invention reduces device MR Resistance (MRR) and improves lapping process control by allowing high aspect ratio (SH/TW), reduces side reading (side shield at ABS), and, through the introduction of back end hard bias, facilitates adjusting the bias point based upon film properties and working requirements. An in-situ initialization method is described for low RA TMR and CPP GMR, where the spin torque effect is large, The main features of the invention that distinguish it from the prior art, are:

1) Longitudinal bias is fully removed to let devices operate in two resistance states, corresponding to Up and Down in the media field, so that the full dR/R potential of the device can be realized. This is equivalent to a utilization rate of 100%.

2) Once longitudinal bias is fully removed, the freed up space can be either filled with insulation or used to house a reader side shield of soft magnetic material to reduce side reading.

3) When the device operates in two states, aspect ratio (SH/TW) requirements can be relaxed as long as the media UP and Down fields are able to switch devices between these two states. It is therefore possible to retain current low AR limits (0.9×) while raising current high AR limits from 1.3× up to 2×. With high AR, film properties such as pinning strength can be relaxed.

4) When the device operates in its two states, requirements on free layer properties such as coercivity and magnetostriction can be relaxed as long as media Up and Down fields are able to switch devices between these two states.

5) As noted above, vertical bias (relative to ABS), located in the Back End, can be used to customize the magnetic environment seen by the free layer, depending on film properties and specific working requirements. Back end hard bias of this type serves to compensate for offset fields due to interlayer coupling and/or, optionally, to impose an offset field of its own thereby facilitating device operation in either a preferred state or in a no preferred states mode, when the media field is zero. Thus, vertical hard bias allows films having higher interlayer coupling fields to be used.

6) For low RA TMR and CPP GMR, where the spin torque effect is large, an in-situ initialization may be used to set a device in either a high or a low state.

BRIEF DESCRIPTION OF THE DRAWINGS

FIG. 1 is an ABS view of a typical CPP read element of the prior art.

FIG. 2 shows output voltage change with field for a prior art device

FIGS. 6a-c show transverse transfer curves for devices with AR~1, ~67 nm (width)×67 nm (height).

FIGS. 7a-c show transverse transfer curves for devices with AR~2, ~67 nm (width)×130 nm (height).

DESCRIPTION OF THE PREFERRED EMBODIMENTS

Figure 3A:
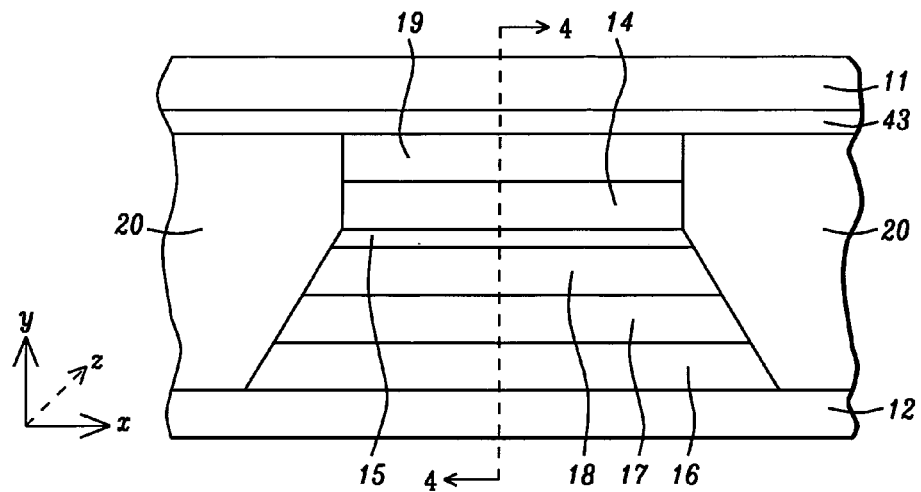
FIGS. 3a-d are ABS views of four possible BORS designs.
Figure 3B:
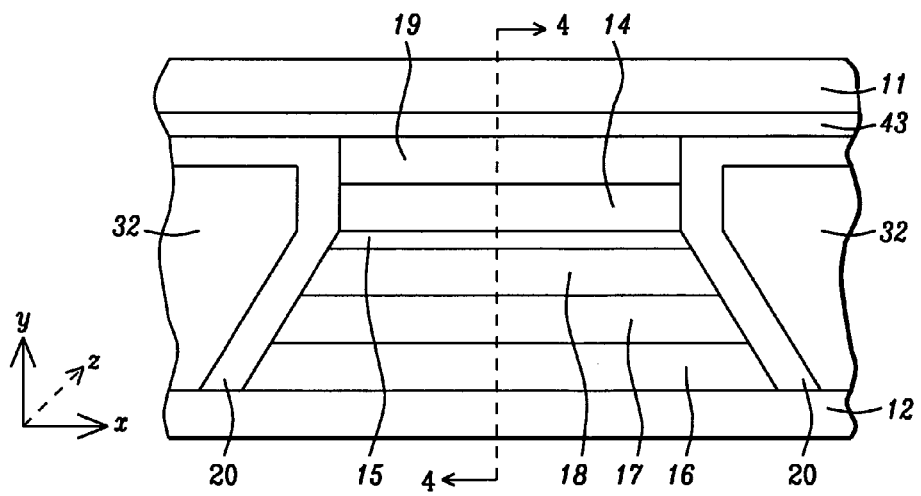
Figure 3C:
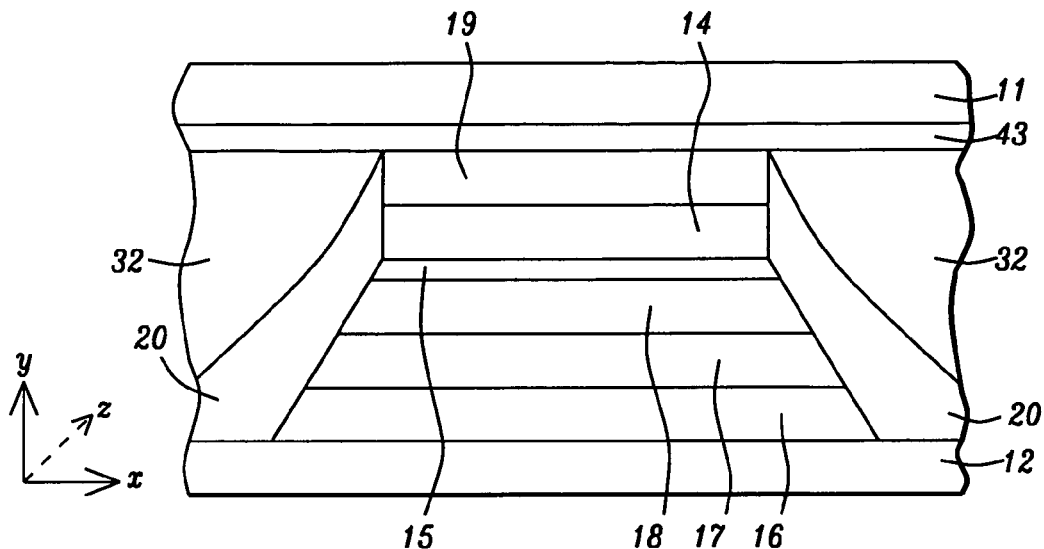
Figure 3D:
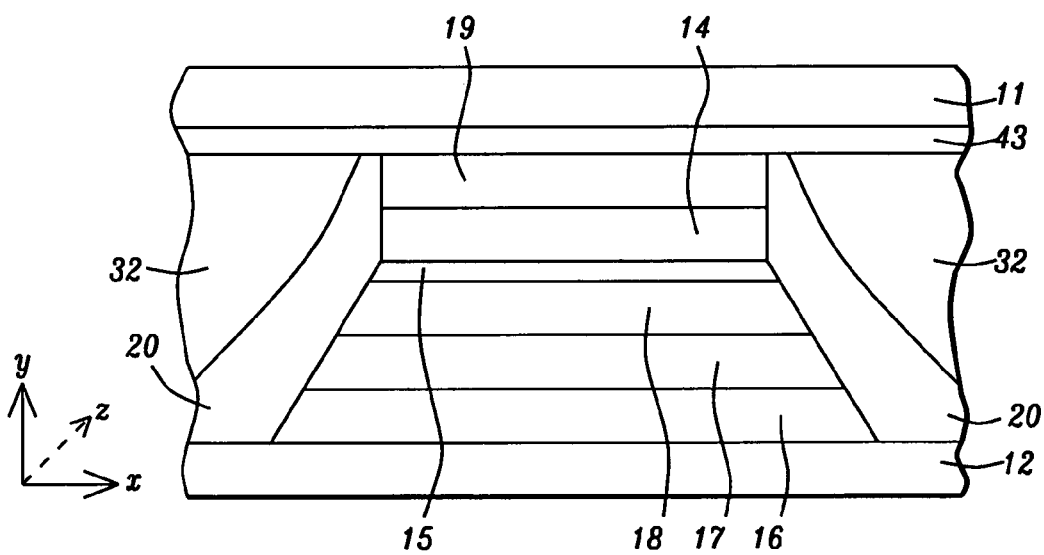

The present invention discloses how to change current reader output from an analog signal to a digitized binary output (low (0) or high (1)). This leads to a utilization rate of nearly 100% and also gives a 3-5 times gain in output. With the present invention's design, the SH can be made to exceed the reader width, an AR of about 2 being acceptable. The advantages associated with this approach are:

1) enables a higher R.A to still work for small reader widths, 2) provides more margin for the ABS lapping process, 3) improves pinning stabilization because (a) the demagnetization field is reduced and (b) the shape anisotropy favors a vertical pinning direction.

We noted earlier the low utilization rate of prior art devices. A key observation, which is central to the present invention, is that this low utilization rate is due to the longitudinal bias. However, since linearity of the output response to the field is crucial for an analog output type reader design, the longitudinal bias is essential and the penalty in utilization rate is unavoidable. An additional, less obvious, penalty is that longitudinal bias field variation from device to device is a major factor in determining device to device output variations.

Thus, eliminating bias magnets, or moving them to the back end of the device, allows the reader to be shielded at its sides, thereby facilitating a reduction in side reading. Additionally, hard bias located in the back end can be normal to the ABS (i.e. vertical rather than longitudinal) so that its field can compensate for the high inter-coupling fields associated with low R.A MgO-based devices. The design of the present invention is particularly well suited to bit patterned media (as opposed to continuous and discrete-track media) which are expected to be adopted at a future time.

Referring now to FIGS. 3, $a$), $b$), $c$), and $d$), these are ABS views of four possible BORS designs. They show the following BORS features:

a) w/o side shield, b) with side shield 32 linked to bottom shield 12, c) with side shield linked to top shield through magnetic layer 33, and d) with side shield 32 linked directly to the top shield.

In FIG. 4 we show four possible back end designs for BORS, with ABS 42 forming the left-most edge. These are cross-sectional views similar (though not necessarily identical to) one taken through line 4-4 in FIG. 3a. The examples shown here are: a) w/o hard bias, b) with hard bias and an extended non magnetic layer 43 located between the capping layer and the top shield, c) with hard bias but no contact with an extended magnetic layer located between the capping layer and the top shield, and d) w/o hard bias and with the pinned layer and the layers below the free layer being significantly wider than the free and transition layers (to help pinning stabilization).

Most of the instances displayed in FIG. 4 could be combined with one or other of the instances shown in FIG. 3 to form the full structure. Typical examples include, but are not limited to:

4a combined with 3a, b, c, or d. Also, 4b can be combined with 3a and 3b if the layer between the cap and the top shield is non-magnetic.

Figure 4A:
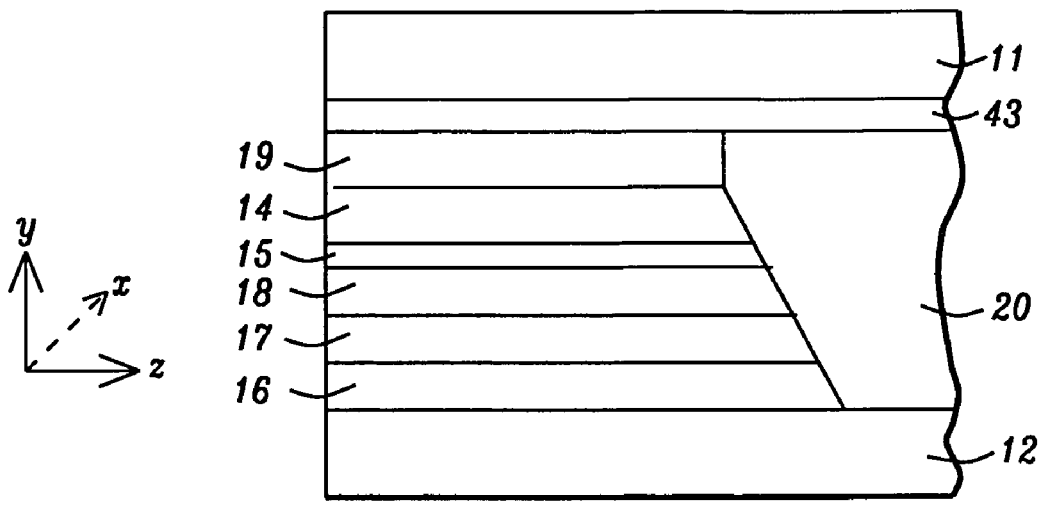
FIGS. 4a-d are four possible cross section views of BROS designs, most of which can be combined with the FIG. 3 structures.
Figure 4B:
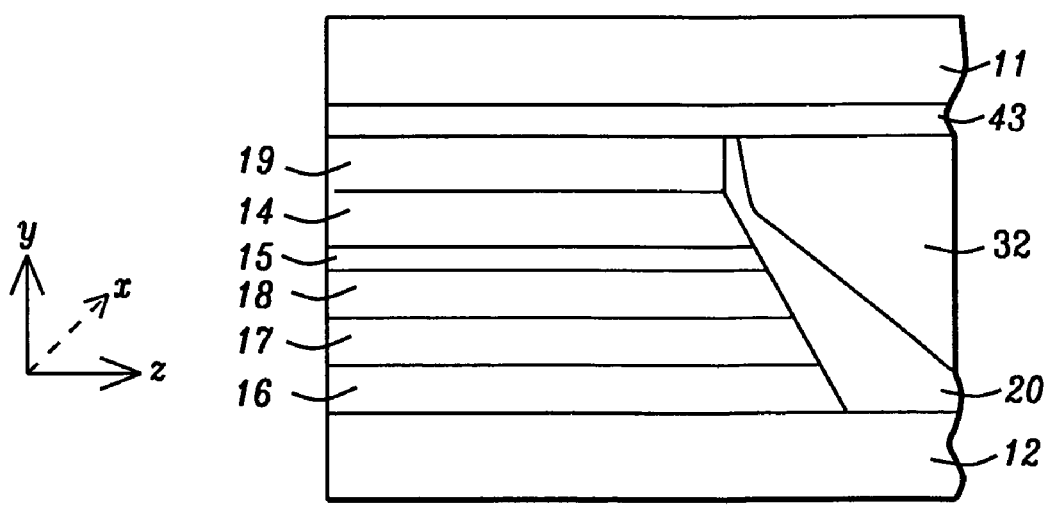
Figure 4C:
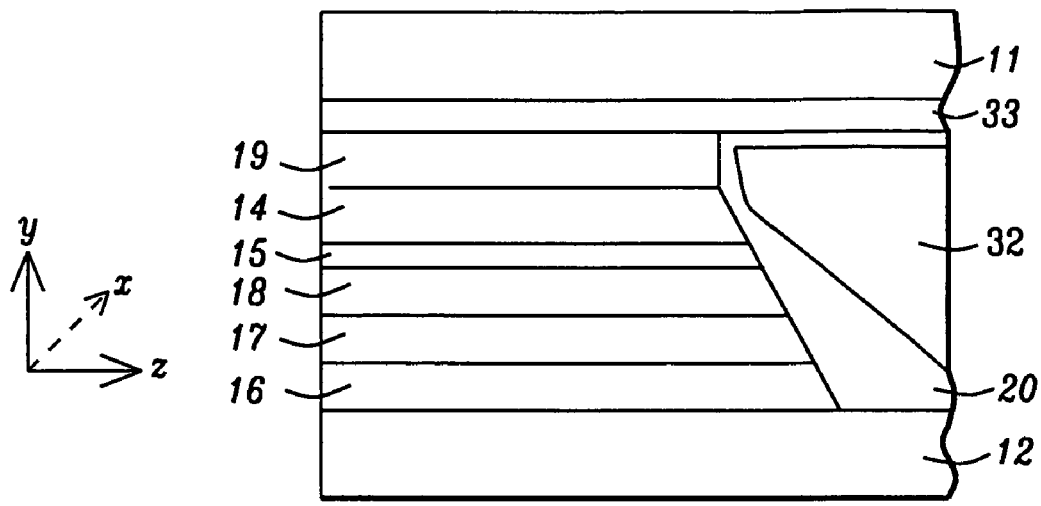
Figure 4D:
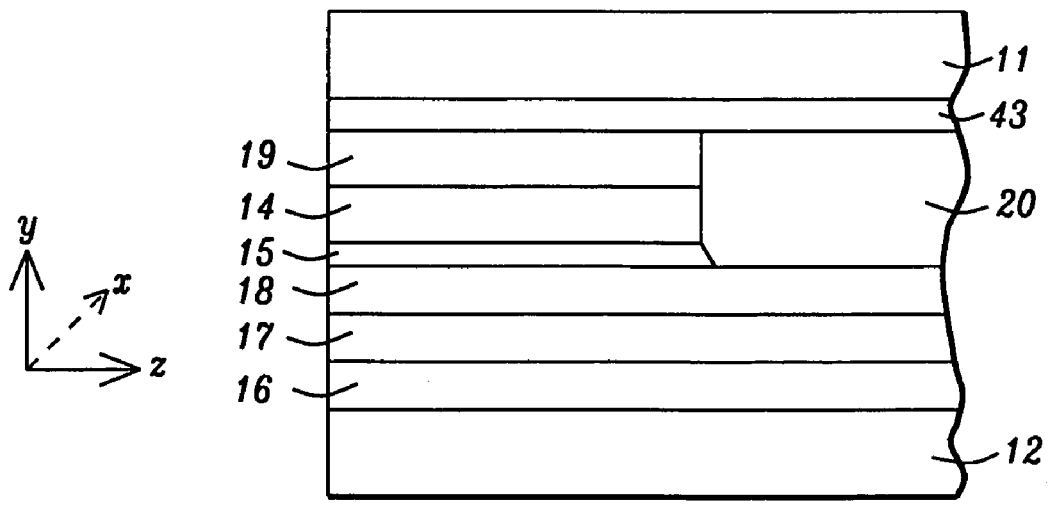
Figure 5A:
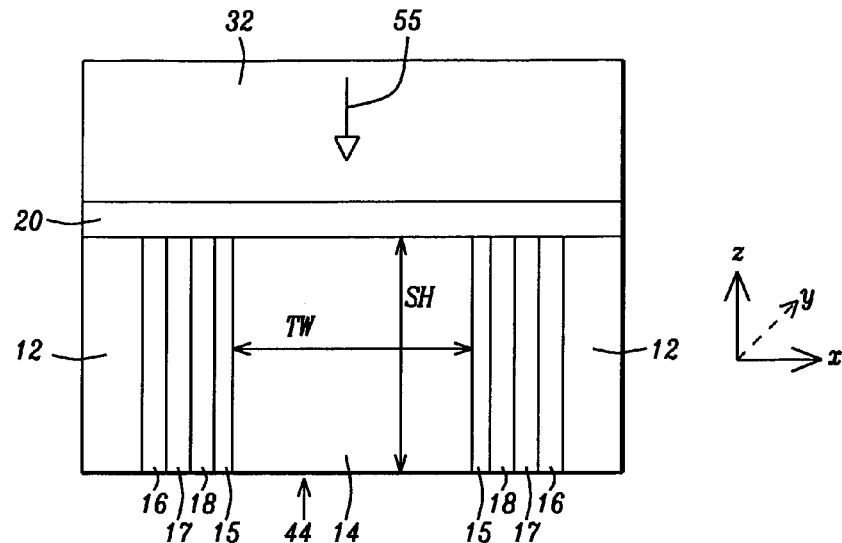
FIGS. 5a-c are plan views of several possible combinations.
Figure 5B:
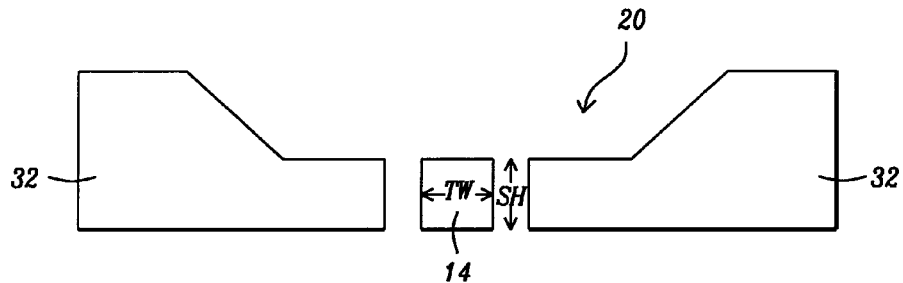
Figure 5C:
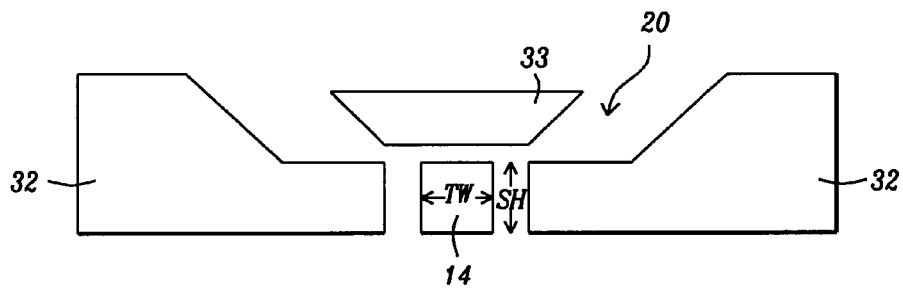

In FIG. 5a we show, in plan view, an example of one such combination (FIG. 4a combined with FIG. 3a.) Seen is the view when looking down on the free layer after layers 11, 43, and 19 have been removed. Note that arrow 55 represents the direction of the vertical magnetic bias. As can be seen, it is normal to the ABS and parallel to SH (stripe height). Conventional longitudinal bias parallels the ABS as well as TW (track width). FIGS. 5b and 5c show some additional combinations seen in plan view. FIG. 5b is 3b, 3c, or 3d combined with 4a or 4d while FIG. 5c shows 3b, 3c, or 3d combined with 4b or 4c.

There are two ways to operate the BORS devices. One is with a preferred state while the other is without one. If, at zero applied field, the device is always in the same state, either high or low, that state would be considered to be a preferred state. Otherwise, the device is considered to be without a preferred state.

The operating type of any specific device will be determined by the properties selected for it by the designer. These properties include the aspect ratio (Stripe Height/Track Width), the amount of vertical bias (if any) at the back end, and the film properties that we include in TABLE I below:

TABLE I

| Property | Range in analog devices | Range in digital devices with no preferred state | Range in digital devices with a preferred state |
| --- | --- | --- | --- |
| Aspect ratio | 0.9-1.3 | 0.9-2 | 0.9-2 |
| Longitudinal bias | YES | No | No |
| Vertical bias | N/A | Yes/No | Yes/No |
| Free layer Coercivity (Oe) | <10 | <20 | <20 |
| Interlayer Coupling field (Oe) | <100 | <200 | <200 |
| Pinning Field Strength (Oe) | >2000 | >1,000 | >1,000 |
| Magnetostriction | ~0 | tunable | tunable |

Design Factors that Determine Device Behavior

Relative to analog devices, digital devices can operate over a wider range of film properties as long as the media Up and Down fields are large enough to switch the devices between their two states.

FIGS. 6a-c and 7a-c each compare transfer curves for a no hard bias, fully patterned device, for three different R.A values. In FIGS. 6a-c, AR~1 (~67 nm width×67 nm height), while in FIGS. 7a-c AR~2 (~67 nm width×130 nm height). These illustrate the design concept and operating windows. In FIGS. 6a-c, (AR~1), 100-200 Oe was enough to saturate the devices while in FIGS. 7a-c, (AR~2), the switching field was around 200-300 Oe. Note that using a thinner/low moment free layer could further reduce the switching field.

In some cases, for proper functioning and/or status checking of a BORS device, it may be advantageous to initialize the device in one particular state. As device R.A and dimensions get smaller, the spin torque effect will be enhanced. This is the torque exerted by a spin-polarized current of charge carriers, e.g. an electron flow, on a thin magnetically excitable layer. The torque counteracts the intrinsic damping of magnetic motion of the excitable layer. This can be overcome by applying a high current pulse to the structure (below electrostatic damage (ESD) limits) to switch or keep the device in the required state. With such a high current pulse (from FL to PL), the spin torque effect will tend to make FL parallel to the PL, thereby initializing the device in its low state.

What is claimed is:

1. A method to form a two state magneto-resistive (MR) device, comprising:
   providing a bottom shield, having a lower surface that is on a substrate, and depositing in succession, on said bottom shield, a seed layer, a pinning layer, a pinned layer, a spacer layer, a free layer, and a capping layer, thereby forming a MR complex;
   patterning said MR complex to form a MR device stack having a front edge that is normal to said bottom shield and a back edge comprising an upper part that is normal to said bottom shield and a lower part that slopes away from said front edge at an angle;
   said upper part comprising said capping layer and said lower part comprising said seed layer, said pinned and pinning layers, said spacer layer and said free layer;
   then lapping said front edge to form an air bearing surface (ABS) whose width defines a track width (TW), and whose distance from said back edge defines a stripe height (SH);
   said SH value ranging from 0.9 to 2 times said TW value;
   forming a back end of said MR complex that extends away from said back edge over said bottom shield; and
   ensuring that said free layer has zero magnetization in a direction parallel to said ABS, whereby, in the presence of an external magnetic field, said MR device has one of only two possible resistance values, giving it a utilization rate of at least 80% and an output signal of at least 56 mV at a full dR/R of about 50% and an applied voltage of about 140 mV.

2. The method of claim 1 wherein, each time said lapping step is completed, SH may deviate from some pre-specified value by up to 20% without affecting subsequent device performance.

3. The method of claim 1 further comprising filling said back end with insulation and then forming a top shield that covers said capping layer and said insulation.

4. The method of claim 1 further comprising:
   depositing a first layer of insulation on said back edge;
   forming a biasing layer of magnetically hard material on said layer of insulation;
   magnetizing said biasing layer in a direction normal to said ABS thereby giving said free layer a vertical bias; and
   then forming a top shield that covers said capping layer, said biasing layer, and said layer of insulation.

5. The method of claim 4 wherein said vertical bias ranges from −200 to +200 Oe whereby said free layer is unaffected by the presence of inter-layer coupling fields up to 200 Oe and by a pinned layer strength of at least 1,000 Oe.

6. The method of claim 4 wherein said vertical bias ranges from −500 to +500 Oe whereby said free layer is unaffected by the presence of inter-layer coupling fields up to 200 Oe and by a pinned layer strength of at least 1,000 Oe.

7. The method of claim 4 further comprising shaping said biasing layer whereby it functions as a pair of opposing side shields thereby reducing errors due to side reading.

8. The method of claim 1 further comprising:
   depositing a first layer of insulation on said back edge;
   forming a layer of magnetically soft material on said layer of insulation;
   then shaping said soft magnetic layer whereby it functions as a pair of opposing side shields that reduce errors due to side reading.

9. The method of claim 8 wherein said side shields are in direct magnetic contact with said bottom shield.

10. The method of claim 8 further comprising:
    forming a magnetic layer that covers said capping layer and said insulation and that is in magnetic contact with said side shields; and
    then forming a top shield that contacts all of said magnetic layer.

11. The method of claim 1 wherein said MR device will operate normally with a resistance area product of up to 1.5 ohm.sq. microns for a reader width down to 20 nm.

12. The method of claim 1 wherein said angle of slope ranges from 45 to 90 degrees.

13. The method of claim 1 wherein said angle of slope parallels said bottom shield whereby only said free layer is modified when achieving said designed SH, thereby giving said pinned layer a higher aspect ratio and more stable pinning.

14. The method of claim 1 further comprising giving said MR device an aspect ratio in the range of from 1 to 2 thereby providing greater margin when lapping said front edge as well as improving pinning stabilization.

15. The method of claim 1 further comprising initializing said read head through use of a strong spin torque effect at low RA (resistance.area product) and high current density thereby setting said MR device in a pre-selected state.

16. A two state magneto-resistive (MR) device, comprising:
    a bottom shield, having a lower surface that is on a substrate;
    on said bottom shield, a MR complex that comprises a seed layer, a pinning layer, a pinned layer, a spacer layer, a free layer, and a capping layer;
    as part of said MR complex, a MR device stack having a front edge that is normal to said bottom shield and a back edge comprising an upper part that is normal to said bottom shield and a lower part that slopes away from said front edge at an angle;
    said upper part comprising said capping and free layers and said spacer layer and said lower part comprising said seed layer and said pinned and pinning layers;

said front edge being an air bearing surface (ABS) whose width defines a track width (TW), and whose distance from said back edge defines a stripe height (SH);

said TW value ranging from 0.9 to 2 times said SH value;

a back end of said MR complex that extends away from said back edge over said bottom shield; and said free layer having zero magnetization in a direction parallel to said ABS, whereby, in the presence of an external magnetic field, said MR device has one of only two possible resistance values, giving it a utilization rate of at least 80% and an output signal of at least 56 mV at a full dR/R of about 50% and an applied voltage of about 140 mV.

17. The MR device described in claim 16 further comprising said back end filled with insulation and a top shield covering said capping layer and said insulation.

18. previously presented) The MR device described in claim 16 further comprising:

a first layer of insulation on said back edge;

a biasing layer of magnetically hard material on said layer of insulation;

said biasing layer being magnetized in a direction normal to said ABS thereby giving said free layer a vertical bias; and a top shield that covers said capping layer, said biasing layer, and said layer of insulation, said vertical bias ranging from −200 to +200 Oe whereby said free layer is unaffected by the presence of inter-layer coupling fields up to 200 Oe and by a pinned layer strength of at least 1,000 Oe.

19. The MR device described in claim 18 wherein said vertical bias ranges from −200 to +200 Oe whereby said free layer is unaffected by the presence of inter-layer coupling fields up to 200 Oe and by a pinned layer strength of at least 1,000 Oe.

20. The MR device described in claim 18 wherein said vertical bias ranges from −500 to +500 Oe whereby said free layer is unaffected by the presence of inter- layer coupling fields up to 200 Oe and by a pinned layer strength of at least 1,000Oe.

21. The MR device described in claim 16 further comprising:

a first layer of insulation on said back edge;

a layer of magnetically soft material on said layer of insulation;

said soft magnetic layer being shaped to function as a pair of opposing side shields that reduce errors due to side reading.

22. The MR device described in claim 21 wherein said side shields are in direct magnetic contact with said bottom shield.

23. The MR device described in claim 21 further comprising:

a magnetic layer that covers said capping layer and said insulation and that is in magnetic contact with said side shields; and a top shield that contacts all of said magnetic layer.

24. The MR device described in claim 16 wherein said MR device will operate normally with a resistance area product of up to 1.5 ohm.sq. microns for a reader width down to 20 nm.

25. The MR device described in claim 16 wherein said angle of slope ranges from 45 to 90 degrees.

26. The MR device described in claim 16 wherein said angle of slope parallels said bottom shield whereby said pinned layer has a higher aspect ratio and more stable pinning.

27. The MR device described in claim 16 further comprising giving said MR device an aspect ratio in the range of from 1 to 2 whereby said MR device will function effectively for RA values up to 1.5 and reader widths down to 20 nm, thereby increasing its degree of pinning stabilization.

* * * * *